United States Patent [19]

Boreas

[11] 4,276,511
[45] Jun. 30, 1981

[54] MAGNETIC SYSTEMS FOR LONG SCALE ELECTRICAL METER WITH MULTIPLE SIDE COIL SENSING

[75] Inventor: Willem J. L. Boreas, Sayreville, N.J.
[73] Assignee: Sangamo Weston, Inc., Newark, N.J.
[21] Appl. No.: 929,885
[22] Filed: Jul. 31, 1978
[51] Int. Cl.³ .............................................. G01R 5/08
[52] U.S. Cl. .................................................. 324/150
[58] Field of Search ............... 324/150, 151 R, 151 A, 324/154 R; 335/222

[56] References Cited

U.S. PATENT DOCUMENTS

| | | | |
|---|---|---|---|
| 3,155,906 | 11/1964 | Roper | 324/150 X |
| 3,181,065 | 4/1965 | Bajars | 324/150 |
| 3,332,013 | 7/1967 | Higley et al. | 324/150 |
| 3,395,349 | 7/1968 | Bajars | 324/150 |
| 3,490,043 | 1/1970 | Faria | 324/151 R X |
| 3,569,832 | 3/1971 | Marusek | 324/150 |
| 3,962,633 | 6/1976 | Nadeau | 324/150 |
| 4,002,978 | 1/1977 | Townorow et al. | 324/150 |

FOREIGN PATENT DOCUMENTS

| | | | |
|---|---|---|---|
| 468790 | 7/1937 | United Kingdom | 324/150 |
| 486695 | 6/1938 | United Kingdom | 324/150 |

*Primary Examiner*—Gerard R. Strecker
*Attorney, Agent, or Firm*—Joseph J. Kaliko; Mikio Ishimaru; Dale V. Gaudier

[57] ABSTRACT

A magnetic system for a long scale electrical meter enables four sided sensing of a coil which is completely offset from the axis of rotation has a cylindrical core pole piece magnetically coupled to first similar poles of two magnets. The core is surrounded by an inner annular air gap defined by a coaxial inner annular pole piece which is magnetically coupled to the second poles of the magnets. Radially outward is an outer annular air gap defined by a coaxial outer annular pole piece which is magnetically coupled to the first magnetic pole. Magnetic fields in the inner and outer air gaps are radial. The outer annular pole piece is closed at opposite ends by a pair of magnetically permeable discs which also are pole pieces for the first magnetic pole. Each disc is spaced apart a distance D from the nearest flat face of the inner annular pole piece to provide axial magnetic fields. Accordingly, all four sides of the coil are active.

A system for three sided sensing is similar but has one magnet and no core piece. Each of two pole pieces has a straight leg section and an annular section. The magnet is positioned between the adjacent but spaced apart leg sections, and the annular sections are concentric to form an annular air gap in which the coil moves. The outer annulus is wider than the inner one, and its flat side faces on both sides are closed by magnetically permeable discs which are equispaced from the side (radially oriented) faces of the inner annular pole piece to provide axial fields.

7 Claims, 6 Drawing Figures

4,276,511

MAGNETIC SYSTEMS FOR LONG SCALE ELECTRICAL METER WITH MULTIPLE SIDE COIL SENSING

BACKGROUND OF THE INVENTION

The present invention relates to magnetic systems for use in long scale electrical meters.

Due to the large deflection angle of long scale instruments, sensing coils have been mounted eccentrically with respect to the axis of rotation so that one or both of the axially oriented legs of the coil are active. To improve the sensitivity of such instruments, a greater force on the coil must be generated by a stronger magnetic field or a larger coil current. Also, in prior efforts the air gap was made as large as possible, and elaborate pole piece systems were devised. These prior art methods resulted in unnecessarily large and expensive instruments. Therefore, the primary object of the present invention is to provide a magnetic system for use with a rotor having any type suspension which will provide multiple side coil sensing, thereby increasing the sensitivity of the instrument.

SUMMARY OF THE INVENTION

That object is achieved by providing a magnetic system for eccentric moving coil meters wherein an inner annular pole piece is surrounded by a wider outer annular pole piece which is closed by magnetically permeable discs at opposite sides. One embodiment includes a core pole piece and results in four side coil sensing. Both the core and the outer annular pole pieces are coupled magnetically to similar poles of a pair of magnets, and the inner annular pole piece is coupled to the opposite magnetic poles to provide two substantially coaxial annular air gaps having radial but opposing magnetic fields. The discs closing the outer annular pole piece are equispaced from the respective nearest faces of the inner annular pole piece. Because the discs are magnetically coupled to the first-named magnetic pole, the radially oriented sides of the coil move through axial magnetic fields.

A second embodiment for three side coil sensing has no core pole piece and only one magnet. Each of two pole pieces have annular sections of different diameters and one annular section is positioned substantially coaxially within the other. Each pole piece is magnetically coupled to a respective pole of a magnet. In the preferred mode each annular section terminates with a straight radially oriented leg section which lies against a magnet pole. As in the first embodiment, the outer annular section is wider than the inner one. Its openings at opposite ends are closed by magnetically permeable discs which are preferably equispaced from the nearest side face of the inner annular pole piece section. The outer axially oriented leg of the coil moves in a radial magnetic field and each side leg moves in an axial magnetic field to result in three side sensing.

BRIEF DESCRIPTION OF THE DRAWINGS

Numerous other objects and advantages of the present invention will be appreciated by those skilled in the art from a reading of the following description of preferred embodiments wherein reference is made to the appended drawings in which.

DESCRIPTION OF A PREFERRED EMBODIMENT

Figure 1:
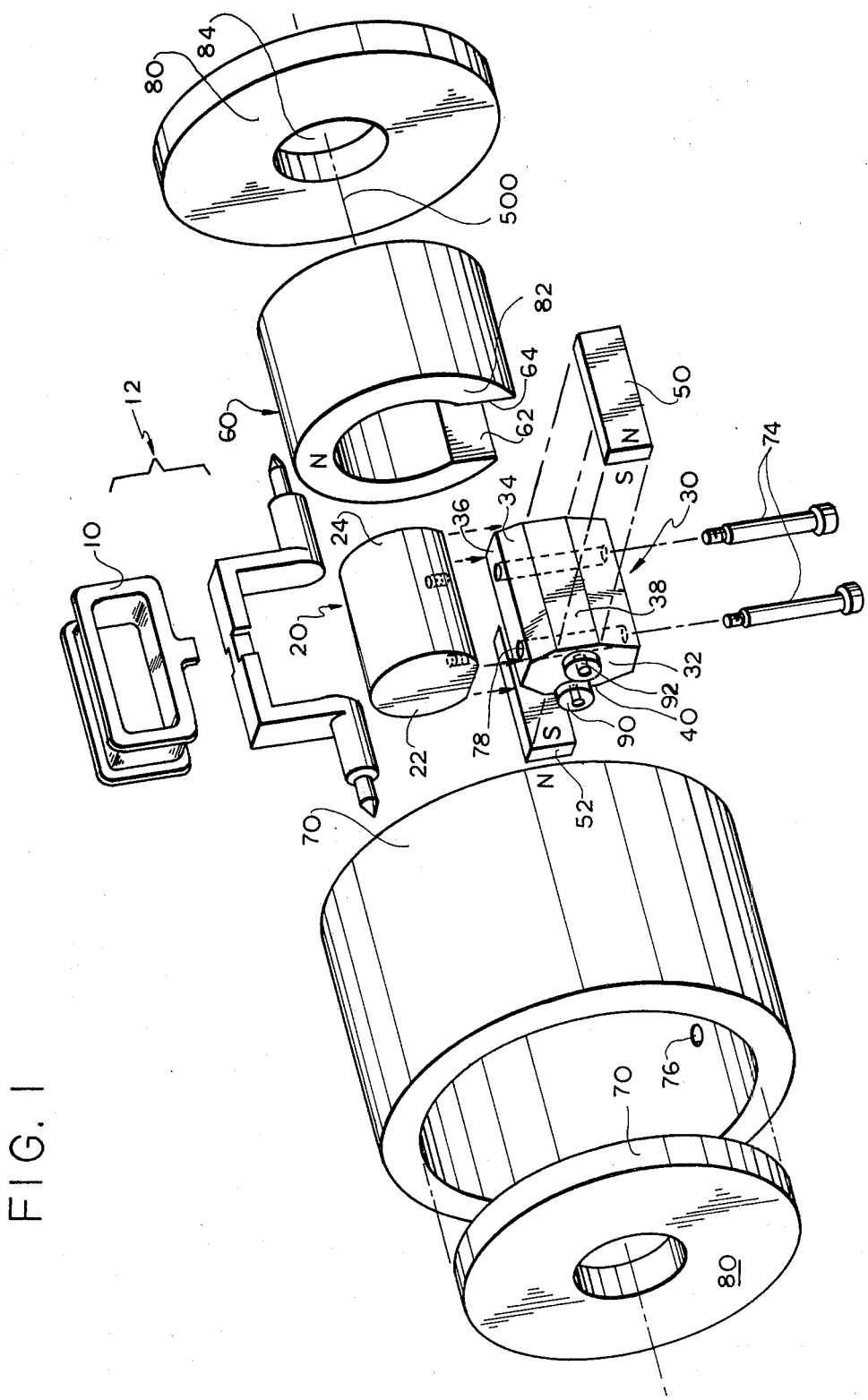
FIG. 1 is an exploded schematic diagram of a magent system for four side sensing built in accordance with the present invention.

One preferred embodiment of the present invention is shown in FIG. 1 in conjunction with a coil 10 which is part of a rotor 12 which for illustrative purposes only is the pivot and jewel type. It will be understood, however, that any type of suspension can be used with the present invention, including specifically filar and taut band suspensions.

The magnetic system of this embodiment and a second embodiment described infra involves magnetic fields through air gaps in both radial and axial directions and, accordingly, includes annular and radial elements. Referring to FIG. 1, at the innermost portion of the system is positioned a soft iron core pole piece 20 which is substantially a right circular cylinder having a pair of flat opposite faces 22 and 24 connected by a flat face 26 cutting a secant through the otherwise circular cross section. Core 20 is coaxial with the axis of rotation 500 of rotor 12.

Made of soft iron and magnetically coupled to core 20, in this case by physical contact, is a pole piece 30 having flat faces 32 and 34 at opposing ends. Pole piece 30 also includes at its most radially inward position a flat face 36 which is connected to the flat face 26 of core 20 by suitable means. Spanning flat faces 32 and 34 are a pair of opposing flat faces 38 and 40 both of which are connected to similar poles, illustratively south, of magnets 50 and 52. Preferably magnets 50 and 52 are of the cobalt rare earth type which yield very high magnetic fields relative to mass and size. Accordingly, pole piece 20 functions as a magnetic south pole.

Figure 3:
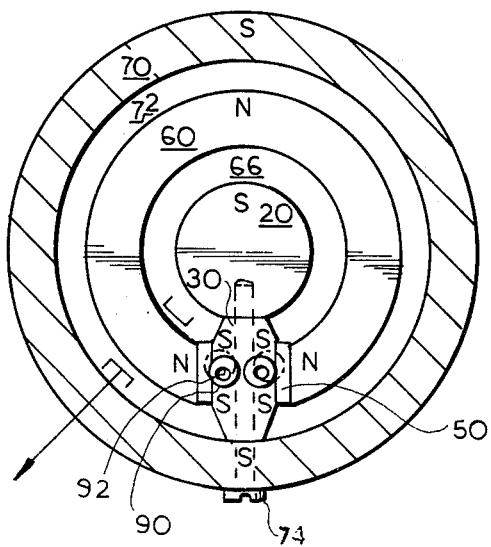
FIG. 3 is a cross sectional diagram taken along the lines III—III of FIG. 2.

Inner annular pole piece 60 is formed of magnetically permeable material such as soft iron in the form of a nearly closed annulus having flat faces 62 and 64 at the discontinuity. Faces 62 and 64 meet the north poles of magnets 50 and 52 respectively so that pole piece 60 is magnetically polarized. As best seen in FIG. 3, pole piece 60 annularly surrounds core 20 to define an inner annular air gap 66 therebetween. Within this area, unobstructed but for pole piece 30, rotates the innermost axially oriented leg of coil 10.

Radially outward and coaxially surrounding pole piece 60 is outer annular pole piece 70 made of a magnetically permeable material such as soft iron. Its inside surface and the outside surface of pole piece 60 define an outer annular air gap 72. The members 20, 60 and 70 are preferably so dimensioned that the radial width of air gaps 66 and 72 are equal. As best seen in FIG. 3, pole piece 70 is magnetically coupled to south poles of magnets 50 and 52 by mechanical connection to pole piece 30. As shown in FIG. 1, this may be achieved illustratively by use of bolts 74 passing radially inward through holes 76 in pole piece 70, through holes 78 in a pole piece 30, ultimately into core 20.

Figure 2:
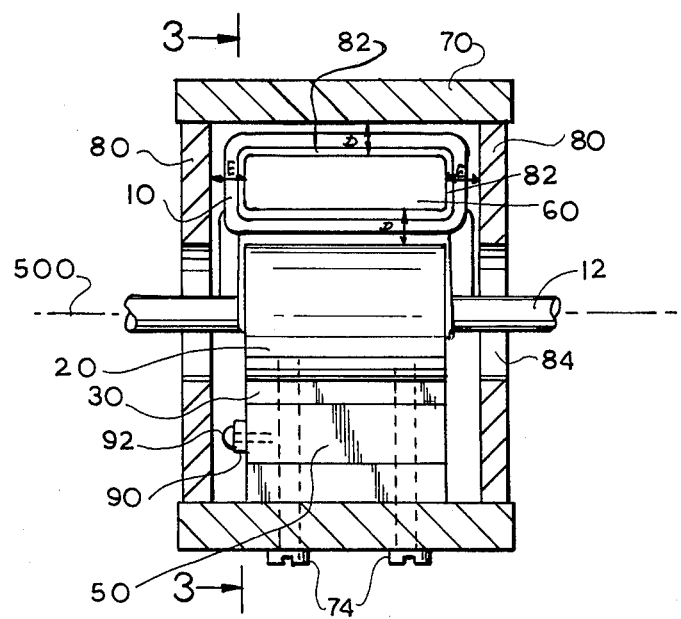
FIG. 2 is a schematic side view of the system of FIG. 1 with parts broken away.

As best seen in FIG. 2, a pair of discs 80 made of magnetically permeable material such as soft iron seal the openings at opposite ends of pole piece 70. Each disc 80 is radially oriented and magnetically coupled to the south poles of magnets 50 and 52. The axial width of inner annular pole piece 60 is smaller than that of outer annular pole piece 70 so that radially oriented air gaps are located axially forward and rearward of pole piece 60. Discs 80 are spaced apart from the nearest flat face 82 of pole piece 60 by equal amounts, preferably the radial width of annular air gaps 66 and 72. Discs 80 each include apertures 84 to allow passage of the suspension means of rotor 12 whether by the shaft of a pivot and jewel mechanism or the ribbons of a taut band mechanism, or otherwise.

As can be seen in FIGS. 1 and 2, coil 10 is completely offset from the axis of rotation 500, that is, the axis of rotation does not pass through the periphery of coil 10. The axially oriented legs of coil 10 move in the annular air gaps 66 and 72 radially next to annular pole piece 60. Each of air gaps 66 and 72 preferably have equal width. As is apparent from FIG. 3, they have radial magnetic fields in opposing directions passing therethrough.

The radially oriented legs of coil 10 move in air gaps shown most clearly in FIG. 2 which have magnetic fields passing from flat side faces 82 of pole piece 60 axially to pole pieces 80. Hence, both the radial and axial sides of coil 10 are active in producing a force upon rotor 12.

As mentioned above, the individual components of the magnetic system may be secured by bolts 74 and/or epoxy or by any other suitable means.

For adjustment of the magnetic flux in the air gaps, two magnetic shunts 90 may be provided, each of which is a small disc made of a magnetically permeable material. The shunts are rotably mounted on pins 92 extending from face 32 and partially cover each of magnets 50 and 52. By increasing the covered magnet area, the flux level in the air gaps can be reduced. Also, by covering one magnet more than the other, the flux level of that magnet will be reduced more than the other, thereby providing adjustment for uniform flux in the air gaps.

Figure 4:
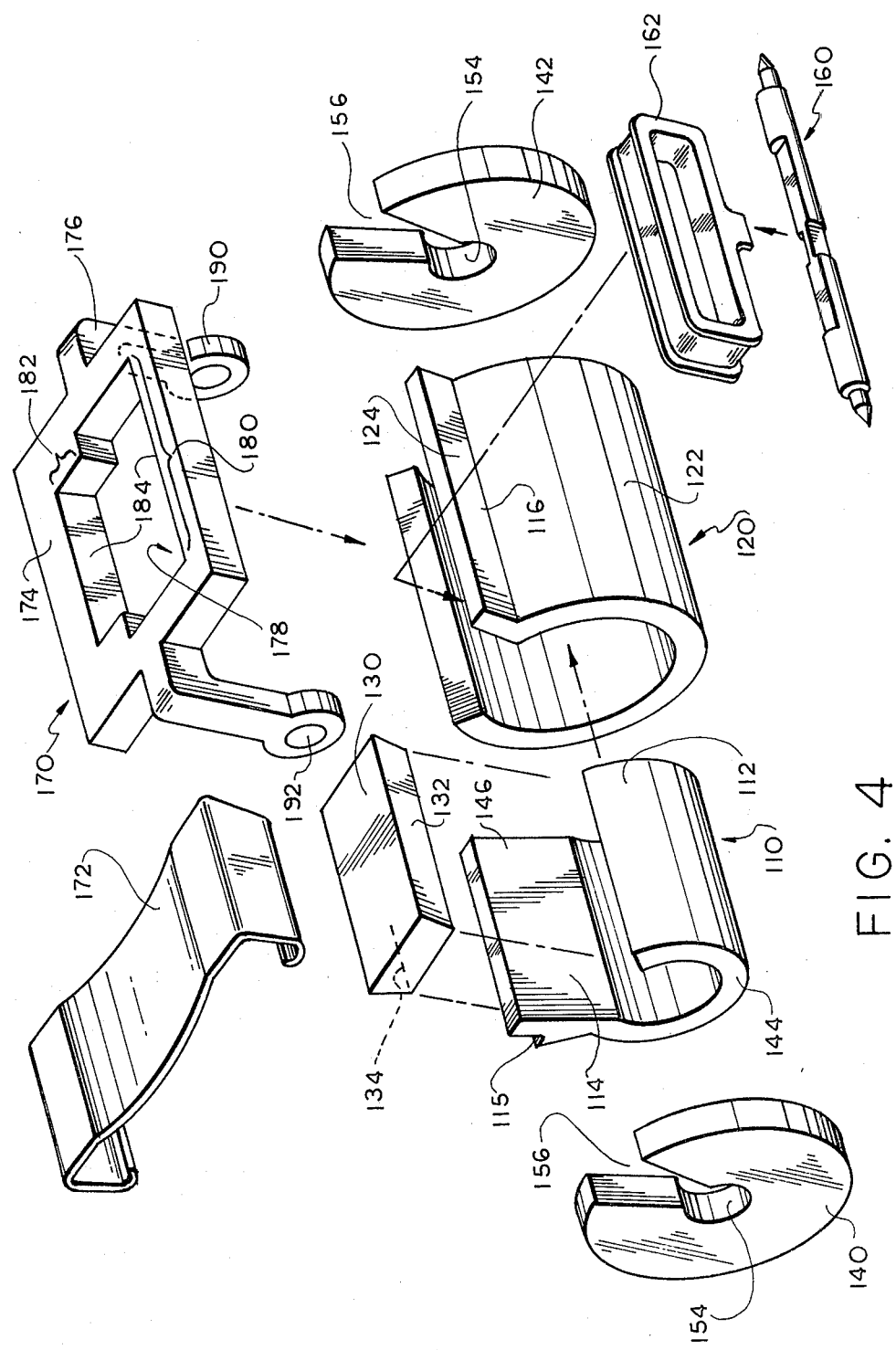
FIG. 4 is an exploded schematic diagram of a system for three sided sensing built in accordance with the present invention.
Figure 5:
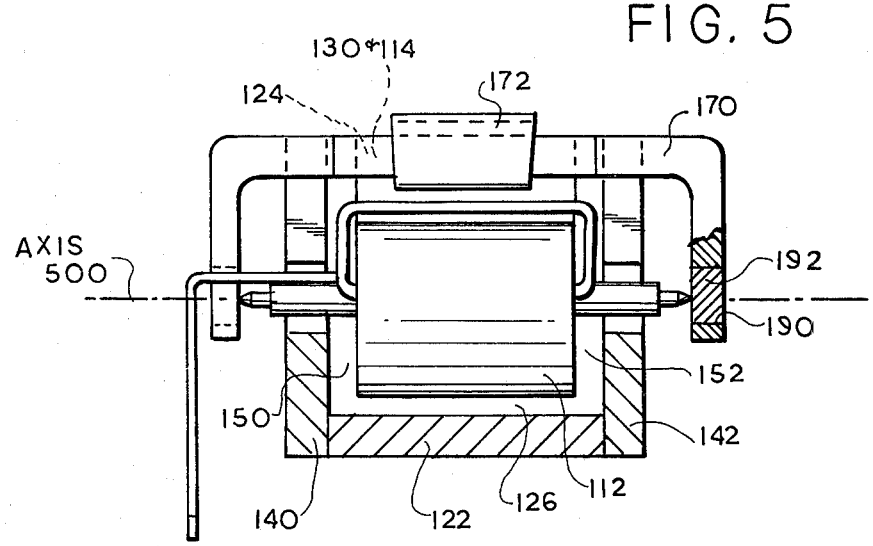
FIG. 5 is a side sectional view of the system of FIG. 4.
Figure 6:
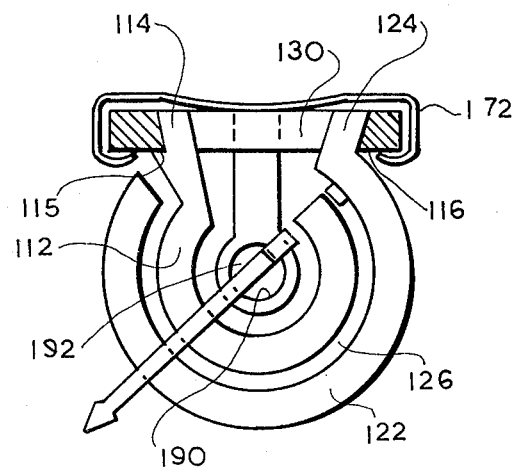
FIG. 6 is a cross sectional diagram taken along the lines VI—VI of FIG. 5.

Referring now to FIGS. 4 through 6, another magnetic system for long scale electrical meters with three side coil sensing is shown. The system is similar to the embodiment first described but lacks a core member.

As best seen in FIG. 4, a pole piece 110 made of a magnetically permeable material includes a nearly closed annular portion 112 and a leg portion 114 extending therefrom. In cross section (FIG. 6) pole piece 110 resembles an inverted question mark.

Another pole piece 120 is similar to pole piece 110 but is larger in dimension. It includes a nearly closed annular portion 122 and a leg portion 124 which extends vertically upward. The axial width of pole piece 120 exceeds that of pole piece 110, and the inside radius of the annual portion 122 exceeds the outside radius of annular portion 112 (best seen in FIG. 6), so that an annular air gap 126 is located between annular portions 110 and 120 when pole piece 110 is located substantially coaxially inside pole piece 120.

A magnet 130 has its poles 132 and 134 oriented left to right (FIGS. 4 and 6) and is located between leg portions 114 and 124. Magnet 130 may be keystone shaped or a right parallelopiped, or any other convenient shape, so long as pole piece 110 is magnetically coupled to one magnetic pole and pole piece 120 is magnetically coupled to the other magnetic pole.

A pair of front and back discs 140 and 142 respectively made of magnetically permeable material are positioned at opposing ends of pole piece 120 and magnetically coupled thereto. As best seen in FIG. 5, discs 140 and 142 are each equispaced from the respective nearest side face 144, 146 of pole piece 110. Accordingly, radially oriented air gaps 150, 152 are located axially beside pole piece 110. Each of discs 140, 142 includes a centrally located hole 154 and a sectional cutout 156.

Holes 154 are sufficiently large to admit the suspension mechanism of a rotor. As shown in FIG. 4, a pivot and jewel type rotor 160 having a coil 162 is schematically depicted, but it will be understood that any type of suspension may be used.

Referring again to FIG. 4, a nonmagnetic bridge 170 and a clamp 172 (not drawn to scale) may be used to unite pole pieces 110 and 120 and magnet 130, but other means such as epoxy or functionally equivalent mechanical devices may be employed to this end. Bridge 170 includes a transverse portion 174 and arms 176 downwardly depending therefrom. A T-shaped aperture 178 extends through portion 174. Aperture 178 includes an axially oriented portion 180 and a portion 182 extending perpendicularly therefrom. Leg portion 124 is positioned within hole portion 180, and leg portion 114 and magnet 130 are positioned in hole portion 182. As can be seen in FIG. 4, the dimensions of hole portion 180 correspond to those of leg 124, and the dimensions of hole portion 182 correspond to those of magnet 130 and leg portion 114. Opposing walls 184 of hole 178 are tapered to correspond to the keystone shape of magnet 130.

Arms 176 are dimensioned to extend through cutouts 156 so that the free ends 190 of arms 176 are located coaxially with axis 500. Holes 192 in free ends 190 admit the suspension means of rotor 160.

To assemble this magnetic system, rotor 160 is positioned over portion 112 which is then positioned in pole 122. Then extensions 114 and 124 are inserted into hole 178. Magnet 130 is then inserted between extensions 114 and 124 and secured by the spring clip or cement. As shown in FIG. 4, poleshoe 110 includes an axially oriented step 115 which abuts the undersurface of bridge 170 to locate poleshoe 112 radially and axially. The shoulder 116 between extension 124 and portion 122 functions similarly. Next, the jewels are tightened in holes 192 to support rotor 160.

If a taut band rotor is used, it is assembled to the bridge through holes 192. Poleshoe 112 is positioned over rotor 160 so that its shaft is within portion 112. Shoe 122 is positioned over shoe 110 so that the outer leg of the coil is in gap 126. Then the shoes 110 and 120 are rotated and inserted together into aperture 178. Magnet 130 is then placed between sections 114 and 124. If not previously done, then at this time, discs 140 and 142 may be positioned at opposing ends of pole piece 120 and cemented in place.

It will be apparent to those skilled in the art that coil 120 rotates about 500 through a radial megnetic field in gap 126 and through axial fields in gaps 150 and 152. Thus, three sides of coil 162 are sensitive.

The foregoing arrangements are elegant in simplicity and effect. Advantages are the reduction in size and number of parts required for the magnetic system. If a CORE (Cobalt Rare Earth type) magnet is used in the first embodiment, it may first be charged and later mounted in the system, thereby eliminating the severe shocks to which the delicate instrument components would be subjected to during magnetic charging. In the second embodiment, a conventional ALNICO magnet can be used.

Those skilled in the art will appreciate that various modifications can be made to the preferred embodiments. It is preferred, therefore, that this disclosure be taken in an illustrative sense and that the scope of protection afforded be determined by the following claims.

I claim:

1. A magnetic system for a rotor having a coil, said coil including at least two radially oriented sides and at least two axially oriented sides, for four side coil sensing, said magnetic system comprising:
   at least one magnet having poles;
   a core pole piece;
   an outer annular pole piece having two axial ends, said outer annular pole piece surrounding said core pole piece and spaced therefrom, both of said pole pieces magnetically coupled to the same pole of said at least one magnet;
   an inner annular pole piece, magnetically coupled to the other pole of said at least one magnet, said inner annular pole piece having an inside radius and disposed substantially between said core pole piece and said outer annular pole piece and defining an inner annular air gap between said core pole piece and said inner annular pole piece and defining an outer annular air gap between said inner annular pole piece and said outer annular pole piece; and
   two radial pole pieces, each magnetically coupled to said same pole and positioned proximate each axial end of said outer annular pole piece and extending radially inwardly at least as far as the inside radius of said inner annular pole piece and spaced therefrom to form radial air gaps, whereby the axially oriented sides of said coil move in said inner and outer annular air gaps through parallel but opposing radial magnetic fields, and the radially oriented sides of said coil move in said radial air gaps through axial but opposing magnetic fields.

2. A magnetic system according to claim 1 wherein said at least one magnet comprises a pair of spaced apart magnets, and said inner annular pole piece includes an axially oriented opening having two faces, each face of which is magnetically coupled to said other pole of said pair of magnets; said system further comprising a further pole piece positioned between said magnets and magnetically coupled to said same pole of said magnets and to said core pole piece and to said outer annular pole piece.

3. A magnetic system according to claims 1 or 2 wherein the radial widths of the inner and outer annular air gaps are equal.

4. A magnetic system according to claim 3 wherein the axial widths of the radial air gaps are substantially equal to the radial width of each of said annular air gaps.

5. A magnetic system according to claims 1 or 2 wherein each of said radial pole pieces includes a central aperture to admit axially projecting portions of said rotor.

6. A magnetic system for a long scale D'Arsonval meter movement for four sided coil sensing, said coil having radially inner and outer sides, said magnetic system comprising:
   substantially a right circular cylindrical core pole piece made of magnetically permeable material positioned substantially coaxially with the axis of rotation of a rotor;
   a pair of magnets;
   a further pole piece made of magnetically permeable material connected to like poles of said magnets and connected magnetically to said core;
   an inner right circular nearly closed annulus having inside and outside radii and positioned substantially coaxially with respect to said core, said annulus being magnetically coupled to the other magnetic poles of said magnets, the inside radius of said annulus exceeding the radius of said core by a distance D to define an inner annular air gap of width D unobstructed but for said further pole piece;
   an outer right circular annulus having an inside radius exceeding the outside radius of said inner annulus by a distance E and oriented substantially coaxially therewith to define an outer annular air gap of width E unobstructed but for said further pole piece, said outer annulus being magnetically coupled to said like poles;
   a pair of magnetically permeable discs covering the opening at opposing ends of said outer annulus, each of said discs including apertures for passage of axially extending members of said rotor, wherein the distances from the inside surfaces of each of said discs to the nearest respective face of said inner annulus are equal;
   means mounting said coil eccentrically with respect to its axis of rotation and having its radially outer side moving in said outer air gap and its inner side moving in said inner air gap.

7. A system according to one of claims 1, 2 or 6 further comprising magnetic shunt means, covering at least partially said at least one magnet for adjusting the flux level in said air gap.

* * * * *